US008978474B2

(12) United States Patent
Bottkol et al.

(10) Patent No.: US 8,978,474 B2
(45) Date of Patent: Mar. 17, 2015

(54) INERTIAL MEASUREMENT SYSTEMS, AND METHODS OF USE AND MANUFACTURE THEREOF

(75) Inventors: Matthew S. Bottkol, Boston, MA (US); Richard D. Elliott, Stoneham, MA (US); Michael Y. Feng, Winchester, MA (US); Thomas F. Marinis, Haverhill, MA (US); Michael F. Mcmanus, Halifax, MA (US); Shan Mohiuddin, Boston, MA (US); Peter G. Sherman, Cambridge, MA (US); John E. Pritchett, Baltimore, MD (US); Jeffery W. Warren, Ellicott City, MD (US); Charles H. Lange, Woodbine, MD (US)

(73) Assignees: The Charles Stark Draper Laboratory, Inc., Cambridge, MA (US); Massachusetts Institute of Technology, Cambridge, MA (US)

( * ) Notice: Subject to any disclaimer, the term of this patent is extended or adjusted under 35 U.S.C. 154(b) by 513 days.

(21) Appl. No.: 13/194,574

(22) Filed: Jul. 29, 2011

(65) Prior Publication Data
US 2013/0025369 A1 Jan. 31, 2013

(51) Int. Cl.
*G01P 15/08* (2006.01)
*H05K 3/30* (2006.01)
*H05K 1/02* (2006.01)

(52) U.S. Cl.
CPC ........ *H05K 1/0201* (2013.01); *H05K 2201/047* (2013.01); *H05K 2201/062* (2013.01); *H05K 2201/10083* (2013.01); *H05K 2201/10151* (2013.01)
USPC .................................................... 73/514.16

(58) Field of Classification Search
CPC .......... H05K 1/0201; H05K 2201/047; H05K 2201/10083
USPC ........................................................ 73/514.16
See application file for complete search history.

(56) References Cited

U.S. PATENT DOCUMENTS

| 5,289,719 | A | 3/1994 | Egley et al. |
| 6,040,625 | A | 3/2000 | Ip |
| 6,456,939 | B1 | 9/2002 | McCall et al. |
| 6,778,908 | B2 | 8/2004 | Martorana et al. |
| 7,350,303 | B2 | 4/2008 | Rock et al. |
| 2004/0149036 | A1* | 8/2004 | Foxlin et al. .................... 73/511 |
| 2005/0104933 | A1* | 5/2005 | Silverbrook et al. ........... 347/56 |
| 2009/0212407 | A1* | 8/2009 | Foster et al. ................... 257/686 |
| 2009/0326851 | A1 | 12/2009 | Tanenhaus |
| 2010/0153012 | A1 | 6/2010 | Chappell et al. |
| 2011/0127365 | A1 | 6/2011 | Chappell |

OTHER PUBLICATIONS

Aggarwal, P., et al. (2008) A Standard Testing and Calibration Procedure for Low Cost MEMS Inertial Sensors and Units, *Journal of Navigation*, 61:323-336 (Abstract).

(Continued)

*Primary Examiner* — Hezron E Williams
*Assistant Examiner* — Gregory J Redmann
(74) *Attorney, Agent, or Firm* — Lando & Anastasi, LLP

(57) ABSTRACT

A micro-electro-mechanical systems (MEMS) inertial measurement system facilitates accurate location and/or attitude measurements via passive thermal management of MEMS inertial sensors. Accuracy of the system is also improved by subjecting the inertial sensors to programmed single-axis gimbal motion, and by performing coarse and fine adjustments to the attitude estimates obtained by the system based on the programmed motion and on the passive thermal management of the sensors.

12 Claims, 6 Drawing Sheets

(56) References Cited

OTHER PUBLICATIONS

Feng, M., et. al., (2010) Electronics Packaging to Isolate MEMS Sensors from Thermal Transients, *International Mechanical Engineering Congress and Exposition*, pp. 1-10.

Naranjo, C., (2008) Analysis and Modeling of MEMS Based Inertial Sensors, *School of Electrical Engineering*, pp. 1-70.

Sherman, P., (2010) Precision Northfinding INS with Low Noise MEMS Inertial Sensors, *JPASS*, pp. 1-16.

Zhang, Q., et al., (2009) Compensation of Temperature Drift of MEMS Gyroscope Using BP Neural Network, *IEEE*, 4 pages.

\* cited by examiner

INERTIAL MEASUREMENT SYSTEMS, AND METHODS OF USE AND MANUFACTURE THEREOF

STATEMENT REGARDING FEDERALLY SPONSORED RESEARCH OR DEVELOPMENT

This invention was made with government support under Contract Number N00024-03-D-6606, which was awarded by the United States Navy and funded, in part, by the United States Army. The U.S. Government has certain rights in the invention.

FIELD OF THE INVENTION

In various embodiments, the present invention relates to inertial-measurement systems and methods and, in particular, to micro-electro-mechanical systems (MEMS) based inertial-measurement systems and methods.

BACKGROUND

Inertial-measurement systems are commonly used in determining the location and/or attitude of an object and in navigation. Such systems are particularly important when communication-based location determination and navigation approaches, e.g., global positioning system (GPS)-based or cell-phone-based approaches, are unavailable or undesirable. Among various inertial-measurement systems, strap-down MEMS-based systems are of significant interest due to their small size, low weight, low cost, and/or low power consumption.

A typical MEMS inertial-measurement system includes a MEMS inertial sensor, such as, for example, an accelerometer for sensing motion in a fixed direction or a gyroscope for sensing angular motion. The motion sensed by the sensor is typically translated into an electrical signal by sensor circuitry associated with the sensor. The sensed signal then represents the detected motion, such as an acceleration or a rate of rotation. One or more sensors and sensor signals may be combined to determine the location and/or attitude of an object to which the measurement system is strapped.

Generally, a "bias" (i.e., an error component) is present in the motion reading provided by inertial sensors, including MEMS sensors. The bias corresponds to an erroneous detection of motion by a sensor when the sensor is not actually moving. The bias of a sensor does not, however, always remain constant. For example, each time the sensor is turned off and then on, the bias may change—a change that is known as turn-on-to-turn-on bias (and is sometimes referred to herein as, simply, the "turn-on" bias). Moreover, as the sensor continues to operate, the bias can "drift," i.e. change over time.

The bias, bias drift, or both can also change due to a change in temperature of the sensor. In a MEMS system, this phenomenon is often of great concern. In particular, to avoid the introduction of electrical noise into the sensor signal it is often desirable to locate the sensor circuitry in proximity to the sensor, e.g., within a few millimeters from the sensor. But, typically, when the sensor circuitry is turned on it heats up rapidly, which may cause the temperature of the sensor to also increase quickly due to the sensor's small size and proximity to the sensor circuitry. In addition, in some situations, when the object to which the inertial-measurement system is attached moves from one location at a certain temperature to another location at a substantially different temperature, e.g., from the inside of a building to the outside, the temperature of the inertial sensor may also change quickly. Such a change in the temperature of the sensor, whether caused by the environment or the sensor circuitry, can change the sensor bias and/or increase bias drift, causing the location, attitude, or navigation information obtained from the sensor to be erroneous.

One approach to mitigate or avoid these problems is to use calibration. For example, the temperature of the inertial sensor may be measured and the sensor reading as indicated by the sensor circuitry adjusted according to a temperature-sensitivity curve known a priori from extensive pre-deployment testing. Unfortunately, such calibration is generally not very effective at detecting turn-on-to-turn-on bias. It also fails to effectively nullify the effect of sudden, large changes in temperature on the bias that can occur when, for example, the environment of the sensor changes.

Another approach is to employ active thermal control. Under this approach, heaters, coolers, or both are typically used to maintain the sensor's temperature nearly constant, regardless of the change in temperature of the sensor circuitry or the sensor's environment. The use of heaters and/or coolers can, however, increase the cost, size, weight, and/or power consumption of the measurement system. For certain applications in which the inertial-measurement system should be small and should operate on limited power, active thermal management may be impractical or infeasible.

Needs therefore exist for improved systems and methods of MEMS based inertial measurement.

SUMMARY

In various embodiments, the present invention enables accurate inertial measurement using MEMS inertial sensors without requiring active thermal management of the sensors. This is achieved, in part, by employing passive thermal management to decrease the rate of change of temperature of the inertial sensor. The passive thermal management described herein may be achieved in four exemplary ways.

First, a thermal impedance path may be provided between the inertial sensor and corresponding sensor circuitry to which the sensor is proximately disposed but is not in direct physical contact with. With such a design, very little, if any, heat dissipated by the sensor circuitry reaches the sensor by conduction, and the temperature of the sensor is less likely to change rapidly when the sensor circuitry heats up after being turned on.

Second, the inertial sensor may be surrounded by a thermal mass. In this way, even if the temperature of the environment to which the thermal mass is exposed changes quickly (e.g., at a rate of a few ° C./min), the thermal mass can cause the temperature of the sensor contained therein to change at a slower rate.

Third, a circuit board that includes the sensor circuitry may also be attached to the same thermal mass as the sensor itself. By sharing the same thermal mass, both the circuitry and the sensor experience similar rates of change in temperature.

Fourth, the sensor circuitry may be connected to a heat sink. The inertial sensor may itself be disposed in proximity to the sensor circuitry but without being in direct physical contact with the heat sink. In this way, the heat generated by the sensor circuitry is dissipated by the heat sink away from the sensor, thereby decreasing the sensor's rate of change of temperature as the sensor circuitry heats up (e.g., once the circuitry is turned on).

In various embodiments, any one or a combination of two, three, or all of these approaches may be utilized to achieve the passive thermal management of a MEMS inertial-measurement system.

As described above, the signals generated by an inertial sensor and its corresponding circuitry typically include errors, such as, for example, turn-on-to-turn-on bias and in-run bias drift. In various embodiments of the invention, the bias error is mitigated or substantially eliminated by subjecting the inertial sensor to programmed single-axis gimbal motion. More specifically, in one embodiment, initial sensor readings obtained at different points of the programmed motion are used to generate coarse estimates of the bias. These estimates and subsequent sensor readings may then be filtered to fine tune various parameters of a model for the MEMS inertial-measurement system, such as bias-drift parameters, temperature sensitivity of the sensor, etc., so as to accurately measure the location and/or attitude of the object to which the measurement system is attached.

In general, in one aspect, embodiments of the invention feature an inertial-measurement system that includes a circuit board having circuitry, a MEMS inertial sensor disposed in proximity to the board, and a thermal impedance path. The sensor is not in direct physical contact with the circuit board. Rather, the sensor has a contact and the thermal impedance path couples the board to the sensor contact. The circuitry generates a sensor signal based on a motion sensed by the sensor.

In some embodiments, the thermal impedance path includes a material having a thermal conductivity lower than that of copper. For example, the material may be kovar. Alternatively, or in addition, the thermal impedance path may have a geometry that substantially reduces heat conduction between the board and the inertial sensor. The thermal impedance path may be sufficiently rigid to support the inertial sensor and maintain a location of the inertial sensor substantially fixed relative to the board. For example, the thermal impedance path may have a cross section of 0.015" by 0.005".

In some embodiments, the inertial-measurement system also includes a thermal mass that surrounds at least a part of the inertial sensor and that decreases a rate of change of temperature of the inertial sensor. The thermal mass may include a material having both a high thermal conductivity and a high specific heat. The thermal mass may, for example, include beryllium an/or aluminum. In some embodiments, the thermal mass includes a cavity and the inertial sensor is positioned within the cavity without contacting the thermal mass. The inertial-measurement system may also include a heat sink in contact with the board to dissipate heat generated by the circuitry away from the inertial sensor.

In some embodiments, the inertial sensor is disposed on a single-axis gimbal, and the motion of the gimbal is controlled according to a program. The inertial-measurement system may also include a coarse estimator for estimating one or more parameters of the inertial sensor based on the sensor signal and the programmed gimbal motion. In addition, the inertial-measurement system may also include a Kalman filter for estimating a plurality of tuning parameters based, at least in part, on the sensor signal and one or more parameters estimated by the coarse estimator. The Kalman filter may also estimate an attitude of the inertial sensor based, at least in part, on the plurality of estimated tuning parameters.

In general, in another aspect, embodiments of the invention feature a method of manufacturing an inertial-measurement system. The method includes disposing a MEMS inertial sensor in proximity to a circuit board without placing the sensor in direct physical contact with the board. The sensor has a contact, and the board includes circuitry for generating a sensor signal based on a motion sensed by the sensor. The method also includes coupling the board to the sensor contact via a thermal impedance path.

The method may include providing a heat sink in contact with the board to dissipate heat generated by the circuitry away from the inertial sensor. In various embodiments, the method includes surrounding at least a part of the inertial sensor with a thermal mass so as to decrease a rate of change of temperature of the inertial sensor. The thermal mass may include a cavity, and the disposing step may include positioning the inertial sensor within the cavity without contacting the thermal mass. In some embodiments, the disposing step includes positioning the inertial sensor on a single-axis gimbal.

In general, in yet another aspect, embodiments of the invention feature a method for determining an attitude of an inertial-measurement system. The method includes controlling a motion of a single-axis gimbal upon which the inertial-measurement system is disposed. The gimbal motion is controlled according to a program. The inertial-measurement system includes a circuit board having circuitry, a MEMS inertial sensor disposed in proximity to the board, and a thermal impedance path. The sensor is not in direct physical contact with the circuit board. Rather, the sensor has a contact and the thermal impedance path couples the board to the sensor contact.

In some embodiments, the controlling step includes maintaining the gimbal in a first dwell position for a first dwell period; moving the gimbal, over a slew period, to a second dwell position; and maintaining the gimbal in the second dwell position for a second dwell period. The first dwell position, the first dwell period, the movement of the gimbal, the slew period, the second dwell position, and the second dwell period may be specified by the program. Moving the gimbal may include rotating the gimbal in a clockwise direction, a counter-clockwise direction, or both. In some embodiments, one or more of the first dwell period, the second dwell period, and the slew period are adjusted according to a rate of change of temperature of the inertial sensor.

The program may include a sequence that repeats periodically, and the sequence may include several dwell positions and several movements. The period of the sequence may be determined according to a thermal sensitivity of the inertial sensor.

In some embodiments, the method also includes estimating, using a coarse filter, one or more parameters of the inertial sensor based on a sensor signal and the gimbal motion. The circuitry on the board generates the sensor signal based on a motion sensed by the inertial sensor. The estimated parameters may include a turn-on bias of the inertial sensor, a parameter of a thermal-bias model of the inertial sensor, and/or an attitude of the inertial sensor.

The method may also include estimating, using a Kalman filter, various tuning parameters based, at least in part, on the sensor signal and the parameters estimated by the coarse estimator. An attitude of the inertial sensor may then be estimated based, at least in part, on the various estimated tuning parameters. The tuning parameters may include an acceleration sensitivity of the inertial sensor, a parameter of a nonlinear thermal bias behavior model of the inertial sensor, and/or a bias instability of the inertial sensor.

The method may also include generating a sensor-error model, and the attitude may be estimated based, at least in part, on an error estimate obtained from the sensor-error model. In various embodiments, the gimbal motion includes a dwell position and a movement, and the sensor signal includes at least one value obtained from the dwell position and at least one value obtained from the movement.

These and other objects, along with advantages and features of the embodiments of the present invention herein disclosed, will become more apparent through reference to the following description, the accompanying drawings, and the claims. Furthermore, it is to be understood that the features of the various embodiments described herein are not mutually exclusive and can exist in various combinations and permutations. As used herein, the term "substantially" means±10%, and in some embodiments ±5%.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DESCRIPTION

Figure 1:
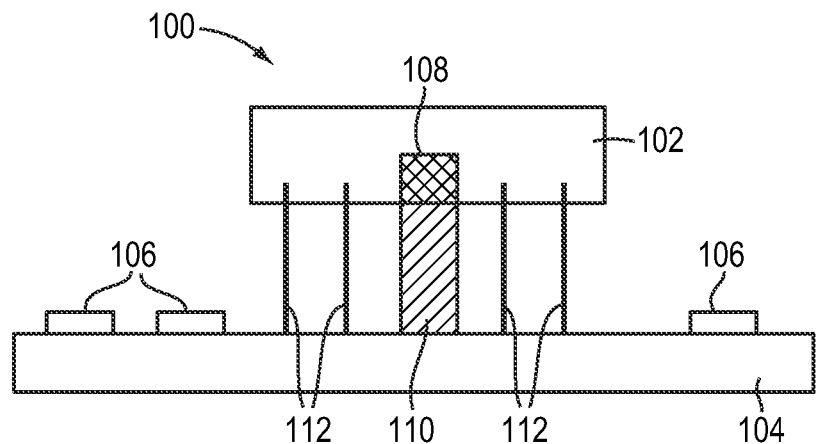
FIG. 1 schematically illustrates a MEMS inertial-measurement system that includes a thermal-impedance path, according to one embodiment of the invention.

FIG. 1 depicts an exemplary MEMS inertial-measurement system 100. The system 100 includes a MEMS inertial sensor 102, which can be, for example, an accelerometer or a gyroscope. The sensor 102 is disposed above a circuit board 104 at a distance of about 2 mm. Thus, the sensor 102 is not in direct physical contact with the circuit board 104. For its part, the circuit board 104 includes sensor circuitry 106 that is in electrical communication with the sensor 102 and that produces a sensor signal representing the motion sensed by the sensor 102.

In one embodiment, the sensor 102 has a contact 108 and is coupled to the circuit board 104 via a lead (or thermal impedance path) 110. A lead 110 having sufficient strength and rigidity (e.g., a kovar lead having a cross section of about 0.015"×0.005") is selected so as to support the sensor 102 and maintain the sensor 102 in a nearly fixed position relative to the circuit board 104 (e.g., at a distance of about 2 mm) over the operational range of acceleration and/or environmental shock that is experienced by the measurement system 100. Thus, if an object to which the system 100 is attached moves, e.g., accelerates, rotates, vibrates, etc., the sensor 102 does not move substantially relative to the circuit board 104. Thin wires 112, such as copper, aluminum, or gold wires of 34 gauge, may be employed to provide electrical communication between the sensor 102 and the components of the circuit board 104 without adding rigidity to the interconnect between the board 104 and the sensor 102. An excessively rigid interconnect can cause stress upon the inertial sensor 102 when the object to which the system 100 is attached moves. In various embodiments, more than one lead 110 (e.g., up to 20 leads 110) and fewer or more than the illustrated four thin wires 112 may be used in the system 100.

In one embodiment, the lead 110 is made from a material having a thermal conductivity that is lower than that of copper, and provides a path of thermal impedance between the circuit board 104 and the sensor 102. For example, the lead 110 may have a thermal conductivity lower than 400 W/m-K, lower than 350 W/m-K, lower than 300 W/m-K, lower than 250 W/m-K, lower than 200 W/m-K, lower than 150 W/m-K, lower than 100 W/m-K, or lower than 50 W/m-K; and in some embodiments may be approximately 17.3 W/m-K (which is, approximately, the thermal conductivity of kovar). In some embodiments, the geometry of the lead 110 is selected so as to substantially reduce heat conduction between the circuit board 104 and the inertial sensor 102. For example, the lead 110 may have a cross section of 0.015"×0.005", which is a geometry that provides high stiffness but minimizes the cross-sectional area for heat conduction. In addition, the material of the lead 110 may be selected such that the lead 110 can be soldered to the board 104. Due to its relatively low thermal conductivity, the lead 110 generally does not conduct the heat dissipated by the components of the board 104 as effectively as a copper wire. In addition, even though the wires 112 may have high thermal conductivity, they are thin, so substantial heat flow by conduction does not occur between the board 104 and the sensor 102.

Given this design, heat flow between the circuit board 104 and the sensor 102 generally occurs at a rate significantly slower than when the sensor 102 is soldered directly to the circuit board 104. Therefore, even if the temperature of the circuitry 106 included on the circuit board 104 increases quickly when the circuitry 106 is turned on (e.g., within a few seconds), the temperature of the sensor 102 will change, if at all, at a significantly slower rate (e.g., over a few minutes).

In general, the thermal-expansion coefficients of the inertial sensor 102 and the circuit board 104 are different, causing them to expand/contract differently when exposed to a change in temperature. The different expansions of the sensor 102 and the circuit board 104 can cause stress on the sensor 102, which can introduce an additional error in the sensor signal obtained from the board 104. As such, in some embodiments, the number of the leads 110 and their locations on the circuit board 104 are selected to provide sufficient rigidity to the sensor 102 and also to absorb that stress.

It should be understood that the distance of 2 mm between the board 104 and the sensor 102 is illustrative, and that shorter or longer distances (e.g., 1 mm, 5 mm, etc.) are within the scope of the invention. The distance may be chosen such that the sensor 102 is located close enough to the board 104 that the noise introduced in the electrical paths between the sensor 102 and the board 104 (e.g., in the wires 112) is not substantial, yet such that the sensor 102 is located far enough away from the board 104 that the sensor temperature does not change rapidly due to the heat dissipated from the board 104.

Figure 2:
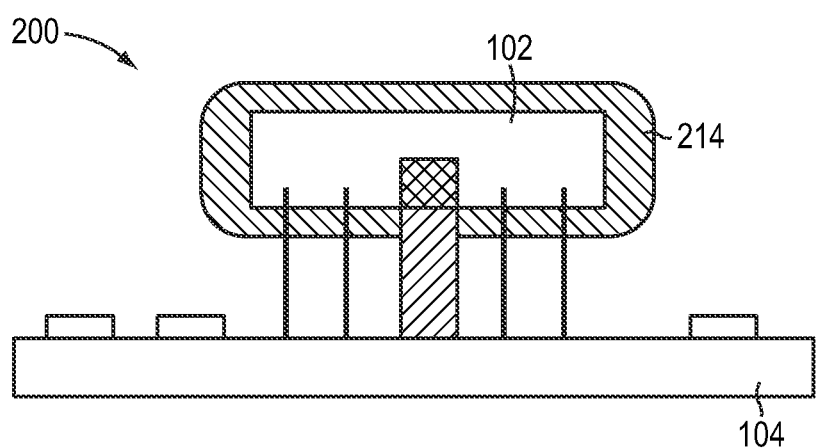
FIG. 2 schematically illustrates a MEMS inertial-measurement system that includes a thermal-impedance path and a thermal mass, according to one embodiment of the invention.

FIG. 2 depicts a MEMS inertial measurement system 200 that is similar to the system 100 shown in FIG. 1. In addition, in the system 200, the sensor 102 is surrounded by a thermal mass 214. The materials suitable for use as the thermal mass 214 include beryllium or aluminum because of their high heat capacity and metallic thermal conductivity, but other metals having these properties are suitable as well. In general, the heat dissipated from the circuit board 104 via convection and/or radiation, and/or the heat introduced to the system 200 by rapid environmental changes, is absorbed by the thermal mass 214 prior to reaching the sensor 102, thereby further slowing the rate of change of temperature of the sensor 102.

In some embodiments, however, the circuit board 104 may also be tightly thermally coupled to the thermal mass 214 so that the temperatures of the circuit board 104 and the sensor 102 track each other, i.e., their temperatures change at substantially the same rate. A compliant, relatively high thermally conductive material, e.g. k=1.5 W/m-K, where k is the thermal conductivity, may be sandwiched between the components on circuit board 104 and the thermal mass 214 to enhance the thermal coupling between the two.

Figure 3A:
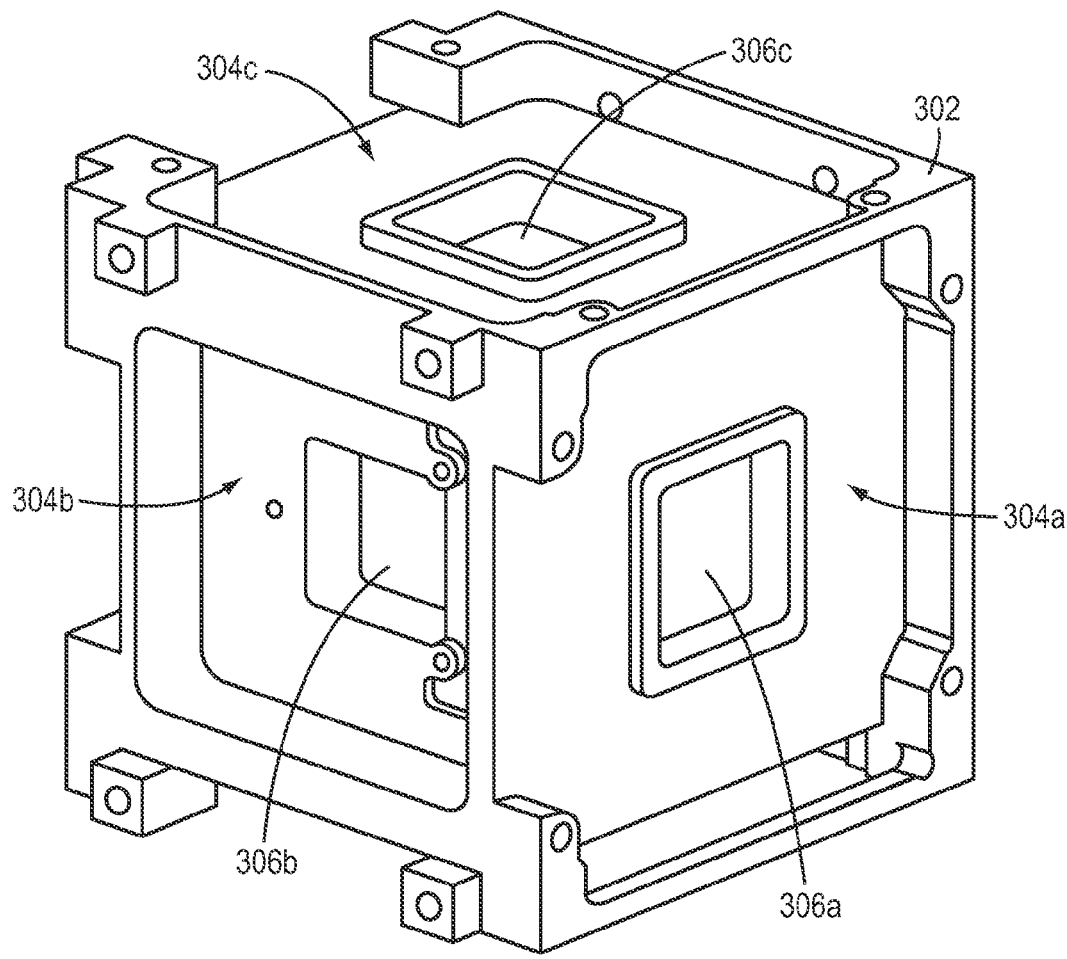
FIGS. 3A and 3B illustrate a MEMS inertial-measurement system that includes a thermal mass, according to another embodiment of the invention.
Figure 3B:
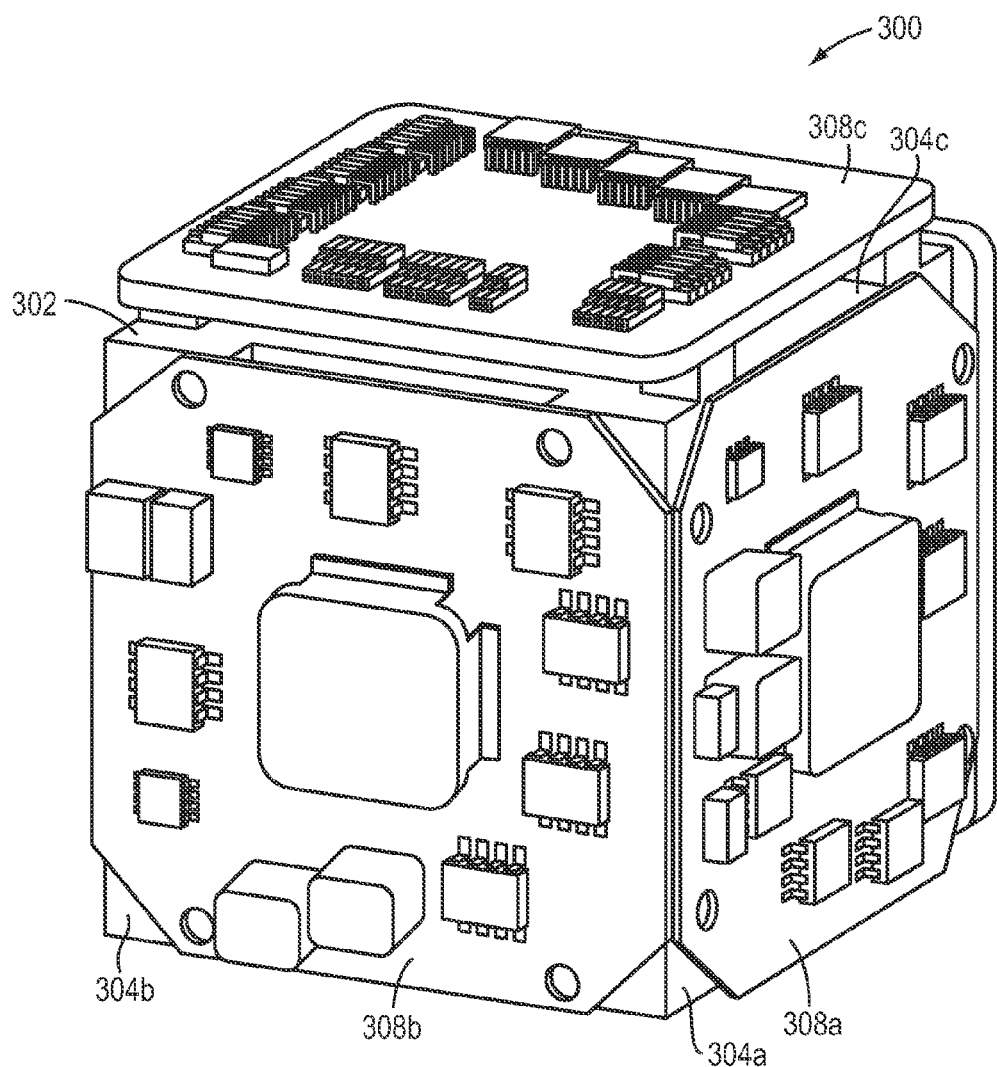

FIG. 3A depicts one embodiment of a thermal mass 302 that may be used in the exemplary inertial-measurement system 300 depicted in FIG. 3B. The thermal mass 302 has six surfaces, of which three surfaces 304a, 304b, 304c are shown. The surfaces 304a, 304b, 304c define cavities 306a, 306b, 306c, respectively. It should be understood that a thermal mass having fewer or more surfaces, and surfaces defining fewer or more cavities, are also within the scope of the invention. As illustrated in FIG. 3B, circuits boards 308a, 308b, 308c are mounted on the surfaces 304a, 304b, 304c, respectively. Each circuit board is in direct physical contact with the corresponding surface of the thermal mass 302. A MEMS inertial sensor, coupled to each board (e.g., the board 308a) using a rigid but stress-absorbing interconnect, is positioned within the cavity defined by the corresponding surface (e.g., the cavity 306a defined by surface 304a, as shown in FIG. 3A) without contacting the thermal mass 302. This enables the sensor and the corresponding sensor electronics to reach thermal equilibrium rapidly, but without the stress that would be introduced into the sensor if it were attached directly to the thermal mass 302.

A heat sink may also be attached to one or more of the circuit boards 304a, 304b, 304c. In this way, some of the heat generated by the circuit boards 304a, 304b, 304c may be dissipated by the heat sink to the surrounding environment, away from the sensors located in the cavities 306a, 306b, 306c. This aids in making the sensors less sensitive to the heating of the circuit boards typically caused when the system 300 and/or one or more of the circuit boards 304a, 304b, 304c are turned on.

Figure 4:
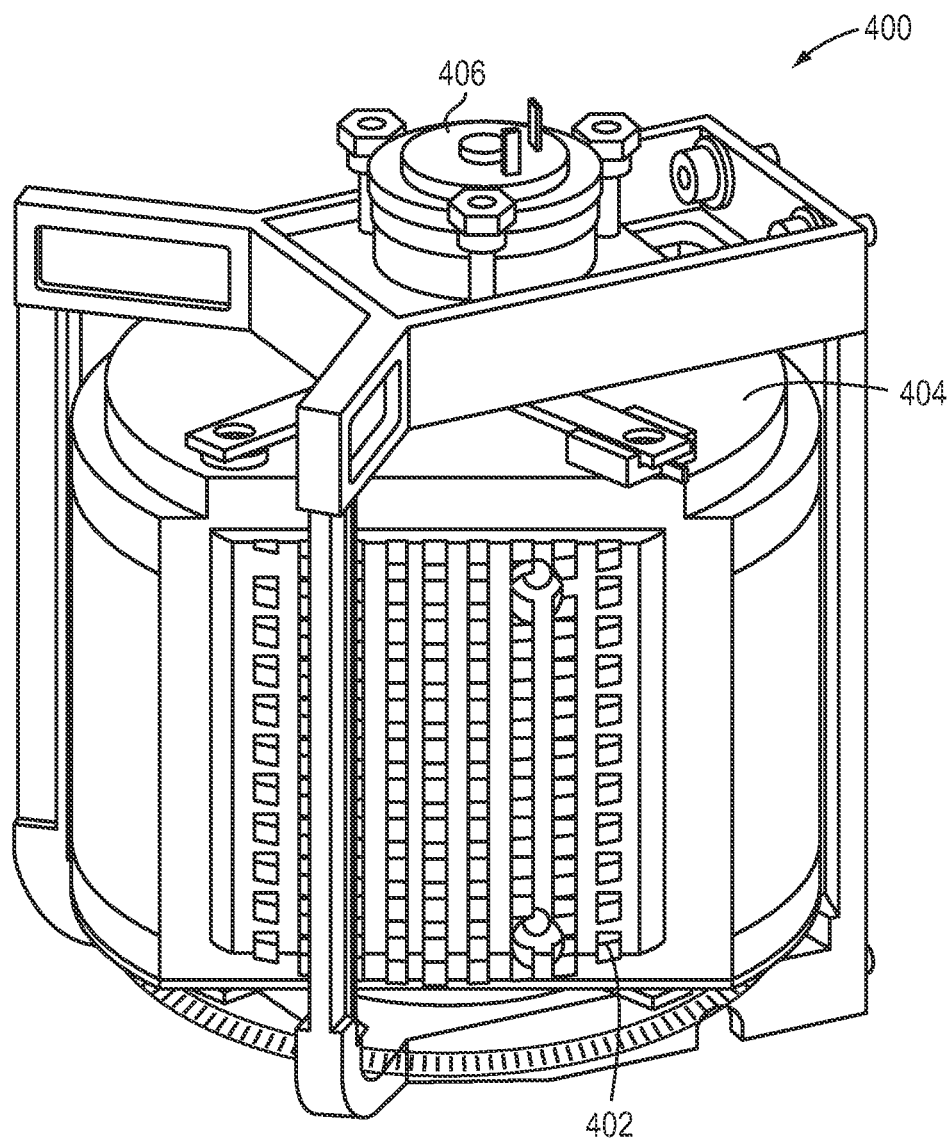
FIG. 4 illustrates a MEMS inertial-measurement system that includes a gimbal and a heat sink, according to one embodiment of the invention.
Figure 5:
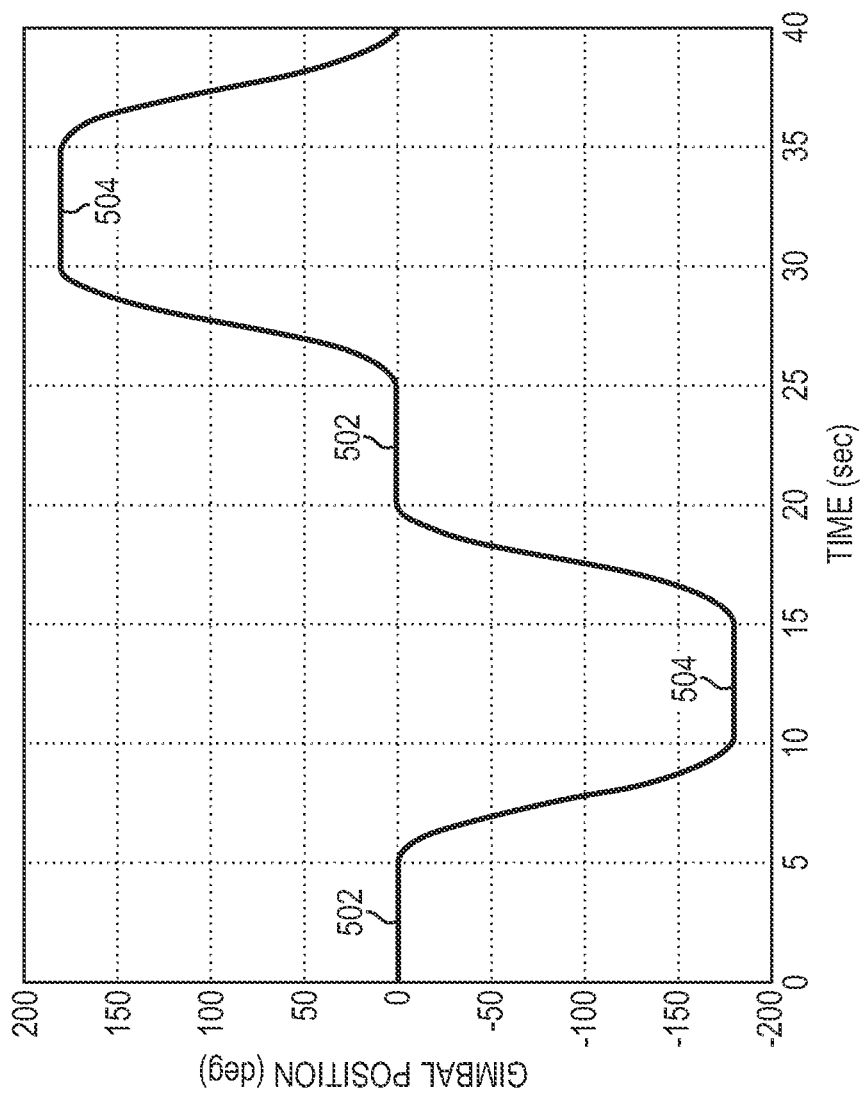
FIG. 5 illustrates an exemplary programmed gimbal motion.

FIG. 4 depicts one embodiment of a MEMS inertial-measurement system 400 that includes a heat sink 402. The heat sink 402 is disposed in thermal contact with a circuit board of an inertial system, such as the system 100 shown in FIG. 1. As illustrated, the heat sink 402 is attached to a single-axis gimbal 404 that may be rotated by a gimbal motor 406. Thus, the inertial sensors are disposed on the gimbal 404 and can be rotated via the gimbal motor 406. The motion of the gimbal 404, an example of which is illustrated in FIG. 5, is controlled by a program (i.e., a sequence of steps). The program may be executed by custom circuitry, or it may be implemented by software stored in memory and executed by a processor. The custom circuitry, memory, and/or processor may be located on one or more circuit boards mounted on the gimbal 404, or may be located on a separate circuit board.

With reference to FIG. 5, an exemplary programmed gimbal motion includes a first position 502 at about 0° at which the gimbal 404 of FIG. 4 dwells (i.e., rests) for a dwell period of about 5 seconds. Then, the gimbal 404 is rotated counter-clockwise by about 180° to a second position 504. The rotation takes about 5 seconds to be completed, and the gimbal 404 dwells in the second position 504 for about 5 seconds. Thereafter, the gimbal 404 is moved back to the first position 502 by rotating it clockwise by about 180°. This rotation also takes about 5 seconds, and the gimbal 404 dwells in the first position 502 for about 5 seconds before it is rotated clockwise by about 180° to the second position 504. The second clockwise rotation also takes about 5 seconds, and the gimbal 404 dwells in the position 504 for about 5 seconds. Then, the gimbal is rotated counter-clockwise by about 180° in about 5 seconds to the first position 502. This sequence of dwelling positions and rotations may be periodically repeated approximately every 40 seconds. As will be understood by one of ordinary skill in the art, the gimbal motion is provided in order to increase the observability (i.e., the detection) of the turn-on bias.

It should be understood that the parameters of the programmed gimbal motion, e.g., the positions (as represented by the angles of rotation, such as 0° and 180°), the movements (such as the clockwise and counter-clockwise rotations), and the dwell and slew (i.e., rotation) periods (i.e., about 5 seconds), are illustrative only and that one or more of the parameters may take on different values. In some embodiments, the program (i.e., the sequence of gimbal positions and movements) may include more than two positions 502, 504, and the period of the sequence may be determined according to a thermal sensitivity of the inertial sensor.

In general, the total period for the set of movements from the initial position through the intermediate stops (i.e., dwells) and back to the initial position must be short enough so that there is not a significant change in the sensor bias and/or other system-error parameters. Typically, when the temperature of a sensor changes, thereby causing the bias and/or other errors to change quickly, the total permissible period decreases. To achieve this, each dwell and/or slew period may be decreased. On the other hand, when the sensor temperature remains substantially constant, the total permissible period increases. In other words, the period may be lengthened if the sensor temperature is stable, thereby avoiding frequent, rapid movements of the gimbal, which in turn can save energy. To achieve this, each dwell and/or slew period may be increased. In effect, one or more of the dwell periods and/or the slew periods may be adjusted according to a rate at which the temperature of the inertial sensor is sensed to be changing.

Figure 6:
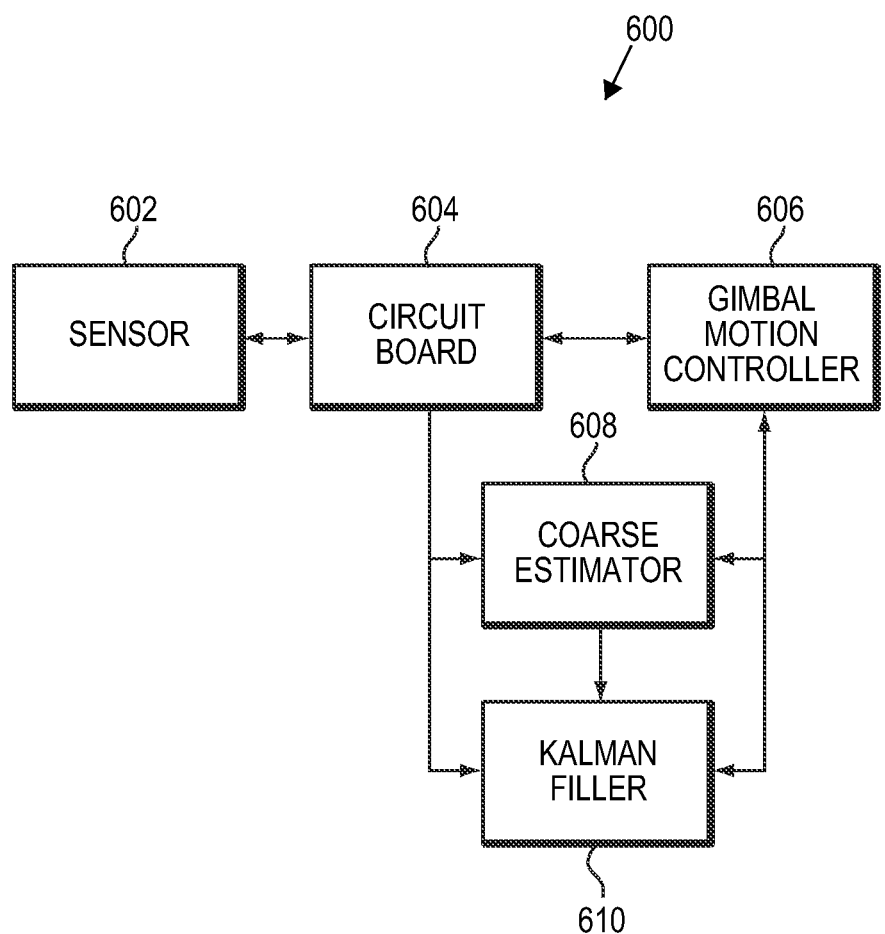
FIG. 6 is a block diagram of a MEMS inertial-measurement system that includes a coarse estimator and a Kalman filter, according to one embodiment of the invention.

FIG. 6 is a block diagram illustrating one embodiment of a MEMS inertial-measurement system 600 that includes a MEMS sensor 602 and a circuit board 604 in electrical communication therewith. The system 600 also includes a gimbal-motion controller 606, a coarse estimator 608, and a Kalman filter 610. The gimbal-motion controller 606 moves the gimbal and the sensor 602 disposed thereupon according to a program, such as that described with reference to FIG. 5. As will be understood by one of ordinary skill in the art, the positions and movements of the gimbal are typically programmed such that analysis of the observed sensor data allows for detection of the bias errors and drift, as described below. Each of the gimbal motion controller 606, coarse estimator 608, and Kalman filter 610 may be implemented by custom circuitry or by software stored in a memory module and executed by a processor. The custom circuitry, memory, and/or processor may be located on the board 604, or may be located on a separate circuit board that is in communication with the board 604.

The program period (e.g., 40 seconds, as described above) is selected to be shorter than the typical sensor instability time period, i.e., the time period over which the sensor bias drifts substantially. The coarse estimator 608 uses the observability of system errors from the programmed gimbal motion to estimate various errors and model parameters as well as an attitude of the inertial-measurement system 600. In particular, a coarse alignment sequence (i.e., the initial period of the program) is used by the coarse estimator 608 to estimate gross system errors, e.g., the turn-on bias, parameters of a thermal-bias model, etc. The coarse estimator 608 accepts as input the program information and the sensor data when the gimbal and the sensor 602 are in their dwell positions, e.g., the positions 502, 504 of FIG. 5. As is commonly known, the invariance of the turn-on bias in the sensor output to the orientation of the sensor's input axis with respect to an inertial rate (i.e., a rate of angular movement) provides a method for observing and estimating the turn-on bias. The inertial rate can be the earth's planetary polar axial rotation rate or a known platform rate. An example of a known platform rate is the orbital motion of a satellite on which the MEMS inertial-measurement system and the gimbal mechanism are mounted.

In general, the thermal sensitivity of the sensor 602 can be modeled based on various characteristics of the system 600 (e.g., the distance between the sensor 602 and the circuit board 604, the size and material of the thermal impedance path coupling the senor 602 and the circuit board 604, properties of the thermal mass, etc.). In some embodiments, the parameters of the thermal-bias model (also called a thermal-sensitivity model) are determined by the coarse estimator 608 by estimating the turn-on bias, as described above, during several periods of the programmed motion. The sensor temperature during each period is also measured. By correlating the changes in the turn-on bias between the different periods with the corresponding sensor temperatures, the coarse estimator 608 determines the parameters of the thermal-bias model of the sensor 602.

In addition, the coarse estimator 608 may also provide an initial estimate of the inertial-measurement system's attitude, i.e., the orientation of the inertial-measurement system with respect to the platform providing the inertial rate, e.g., the surface of the earth or the orbiting satellite. The attitude on an earth mounted system is derived by using accelerometers to estimate the orientation of the inertial-measurement system with respect to a reference level and by using gyroscopes to sense the proportion of the earth's polar rate on the level gyroscope axes to estimate the angular motion of the system.

Even though the coarse estimator 608 can estimate and reduce, or substantially eliminate, turn-on bias, other errors such as bias drift and errors in sensor readings due to a change in the temperature of the sensor 602 and/or the circuit board 604 may affect the performance of the inertial-measurement system 600. The estimates generated by the coarse estimator 608 (i.e., the turn-on bias, the thermal bias model parameters, and the attitude of the sensor 602) may thus be utilized by the Kalman filter 610 to fine tune the system 600. The Kalman filter 610 converges faster and more reliably to an accurate estimate of a measured value when the errors the Kalman filter 610 must estimate are small. As described above, the coarse estimator 608 can remove large turn-on bias, and may provide initial attitude estimates so that the errors the Kalman filter 610 needs to estimate during convergence are small.

The Kalman filter 610 may also estimate other system errors having a smaller impact on attitude estimation. These errors may be modeled using various sensor-error models, such as a sensor bias instability model, a sensor misalignment model, a model for acceleration sensitivity, a nonlinear thermal-bias behavior model, and a nonlinear scaling model. In particular, using the sensor bias instability model and the acceleration-sensitivity model, the Kalman Filter 610 can provide an estimate of the bias drift as the sensor 602 is operated continuously over a certain time period. For this, the Kalman Filter 610 may correlate additional sensor measurements, as described below, and estimate coefficients for various parameters of each of these models.

The nonlinear thermal-bias behavior model, which may be related to the thermal bias model that is based on the characteristics of the system 600, as described above, can provide accurate estimates of the bias drift due to a change in temperature of the sensor 602. In general, the Kalman filter 610 is operated in a similar fashion as the coarse estimator 608 to determine the parameters of the temperature-bias model. By correlating various sensor data and sensor-temperature values, the Kalman filter 610 can determine and refine the parameters of the nonlinear thermal-bias model.

The Kalman filter 610 also receives additional sensor data from the circuit board 604 while the gimbal is in a dwell position or while it is moving (e.g., rotating clockwise or counter-clockwise). The angle readout from the gimbal motion controller 606 is measured prior to and after a programmed motion step. The measured angular change is compared with the estimated angular change derived from the inertial sensors and is used along with temperature sensor measurements to estimate inertial sensor errors. Using the estimates from the coarse estimator 608, the additional sensor data, and the program information from the gimbal motion controller 606, the Kalman filter 610 generates parameters of the various sensor models described above to fine tune the system 600.

In this it is assumed that the inertial inputs to the sensors derive from the platform (earth or satellite orbital trajectory) motion and the programmed motion only. A small level of user or base motion in each of the six degrees of freedom of inertial sensing can be tolerated. Examples of small user or base motions include small amplitude vibrations at the mounting base of the inertial-measurement unit exciting linear or rotational vibratory motions at the sensors that do not significantly degrade the system performance. Large disturbances or user motions are detected by the coarse estimator 608 that may then pause the estimation process until the disturbance subsides. In some embodiments, the gimbal-motion controller 606 includes additional control circuitry and/or software to detect a large disturbance based on a signal received from the coarse estimator 608, and to signal the coarse estimator 608 to pause the estimation process.

Combining the constrained motion assumptions described above with a precise knowledge of the gimbal position based on the angle readout and measurements of the temperature of the sensor 602, the Kalman filter 610 can further reduce or substantially eliminate the bias and/or drift errors. Accordingly, the MEMS inertial-measurement system 600 can quickly converge to a substantially error-free state and may operate in that state to provide accurate estimates of the location and/or attitude of the object to which the system 600 is attached.

While the invention has been particularly shown and described with reference to specific embodiments, it will be understood by those skilled in the art that various changes in form and detail may be made therein without departing from the spirit and scope of the invention as defined by the appended claims. The scope of the invention is thus indicated by the appended claims and all changes that come within the meaning and range of equivalency of the claims are therefore intended to be embraced.

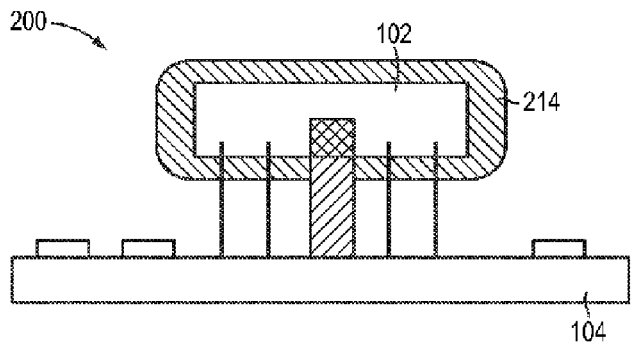

What is claimed is:

1. An inertial-measurement system, comprising:
   a micro-electro-mechanical systems (MEMS) inertial sensor having a sensor contact and being constructed to provide an indication of motion;
   a circuit board comprising circuitry constructed to receive the indication of motion from the inertial sensor and generate a sensor signal based on the indication of motion, the circuit board disposed in proximity to the inertial sensor without being in direct physical contact therewith; and a thermal impedance path coupling the circuit board to the sensor contact, the thermal impedance path comprising a material having a thermal conductivity lower than that of copper.

2. The inertial-measurement system of claim 1, wherein the material is kovar.

3. The inertial-measurement system of claim 1, wherein the thermal impedance path has a geometry that substantially reduces heat conduction between the board and the inertial sensor.

4. The inertial-measurement system of claim 1, wherein the thermal impedance path is sufficiently rigid to support the inertial sensor and maintain a location of the inertial sensor substantially fixed relative to the board.

5. The inertial-measurement system of claim 1, wherein the thermal impedance path is about 0.015" by 0.005" in cross section.

6. The inertial-measurement system of claim 1, further comprising a thermal mass surrounding at least a part of the inertial sensor for decreasing a rate of change of temperature of the inertial sensor, the thermal mass comprising a high thermal conductivity and a high specific heat material.

7. The inertial-measurement system of claim 6, wherein the thermal mass comprises at least one of beryllium or aluminum.

8. The inertial-measurement system of claim 6, wherein the thermal mass comprises a cavity and the inertial sensor is positioned within the cavity without contacting the thermal mass.

9. The inertial-measurement system of claim 1, further comprising a heat sink in contact with the board for dissipating heat generated by the circuitry away from the inertial sensor.

10. The inertial-measurement system of claim 1, wherein the inertial sensor is disposed on a single-axis gimbal, a motion of which is controlled according to a program.

11. The inertial-measurement system of claim 10, further comprising a coarse estimator for estimating at least one parameter of the inertial sensor based on the sensor signal and the gimbal motion.

12. The inertial-measurement system of claim 11, further comprising a Kalman filter for (i) estimating a plurality of tuning parameters based, at least in part, on the sensor signal and the at least one parameter estimated by the coarse estimator, and (ii) estimating an attitude of the inertial sensor based, at least in part, on the plurality of estimated tuning parameters.

* * * * *

UNITED STATES PATENT AND TRADEMARK OFFICE
CERTIFICATE OF CORRECTION

| | |
|---|---|
| PATENT NO. | : 8,978,474 B2 |
| APPLICATION NO. | : 13/194574 |
| DATED | : March 17, 2015 |
| INVENTOR(S) | : Matthew S. Bottkol et al. |

It is certified that error appears in the above-identified patent and that said Letters Patent is hereby corrected as shown below:

On the title page replace with the attached title page as shown.

In the Claims:
Column 12, Line 24, insert

-- 13. A method for determining an attitude of an inertial-measurement system, the method comprising:

controlling, according to a program, a motion of a single-axis gimbal upon which the inertial-measurement system is disposed, the inertial-measurement system comprising:

a micro-electro-mechanical systems (MEMS) inertial sensor having a sensor contact and being constructed to provide an indication of motion; and a circuit board comprising circuitry constructed to receive the indication of motion from the inertial sensor and generate a sensor signal based on the indication of motion, the circuit board disposed in proximity to the inertial sensor without being in direct physical contact therewith; and a thermal impedance path coupling the circuit board to the sensor contact, the thermal impedance path comprising a material having a thermal conductivity lower than that of copper.

14. The method of claim 13, wherein the program comprises a sequence that repeats periodically, the sequence comprising a plurality of dwell positions and a plurality of movements, and the period of the sequence being determined according to a thermal sensitivity of the inertial sensor.

Signed and Sealed this
Tenth Day of May, 2016

Michelle K. Lee
*Director of the United States Patent and Trademark Office*

15. The method of claim 13, wherein the controlling step comprises:

maintaining the gimbal in a first dwell position for a first dwell period;

moving the gimbal, over a slew period, to a second dwell position; and maintaining the gimbal in the second dwell position for a second dwell period, the first dwell position, the first dwell period, the movement of the gimbal, the slew period, the second dwell position, and the second dwell period being specified by the program.

16. The method of claim 15, wherein moving the gimbal comprises rotating the gimbal in at least one of a clockwise direction or a counter-clockwise direction.

17. The method of claim 15, further comprising adjusting at least one of the first dwell period, the second dwell period, and the slew period according to a rate of change of temperature of the inertial sensor.

18. The method of claim 13, further comprising estimating, through use of a coarse filter, at least one parameter of the inertial sensor based on the sensor signal and the gimbal motion.

19. The method of claim 18, wherein the at least one parameter is one of a turn-on bias of the inertial sensor, a parameter of a thermal-bias model of the inertial sensor, or an attitude of the inertial sensor.

20. The method of claim 18, wherein the gimbal motion comprises a dwell position and a movement, and the sensor signal comprises at least one value obtained from the dwell position and at least one value obtained from the movement.

21. The method of claim 18, further comprising:

estimating, through use of a Kalman filter, a plurality of tuning parameters based, at least in part, on the sensor signal and the at least one parameter estimated by the coarse estimator; and estimating an attitude of the inertial sensor based, at least in part, on the plurality of estimated tuning parameters.

22. The method of claim 21, wherein a tuning parameter comprises at least one of an acceleration sensitivity of the inertial sensor, a parameter of a nonlinear thermal bias behavior model of the inertial sensor, and a bias instability of the inertial sensor.

23. The method of claim 21, further comprising generating a sensor-error model, wherein the step of estimating the attitude is based, at least in part, on an error estimate obtained from the sensor-error model. --.

(12) United States Patent
Bottkol et al.

(10) Patent No.: US 8,978,474 B2
(45) Date of Patent: Mar. 17, 2015

(54) INERTIAL MEASUREMENT SYSTEMS, AND METHODS OF USE AND MANUFACTURE THEREOF

(75) Inventors: Matthew S. Bottkol, Boston, MA (US); Richard D. Elliott, Stoneham, MA (US); Michael Y. Feng, Winchester, MA (US); Thomas F. Marinis, Haverhill, MA (US); Michael F. Mcmanus, Halifax, MA (US); Shan Mohiuddin, Boston, MA (US); Peter G. Sherman, Cambridge, MA (US); John E. Pritchett, Baltimore, MD (US); Jeffery W. Warren, Ellicott City, MD (US); Charles H. Lange, Woodbine, MD (US)

(73) Assignees: The Charles Stark Draper Laboratory, Inc., Cambridge, MA (US); Massachusetts Institute of Technology, Cambridge, MA (US)

( * ) Notice: Subject to any disclaimer, the term of this patent is extended or adjusted under 35 U.S.C. 154(b) by 513 days.

(21) Appl. No.: 13/194,574

(22) Filed: Jul. 29, 2011

(65) Prior Publication Data
US 2013/0025369 A1 Jan. 31, 2013

(51) Int. Cl.
G01P 15/08 (2006.01)
H05K 3/30 (2006.01)
H05K 1/02 (2006.01)

(52) U.S. Cl.
CPC ........ *H05K 1/0201* (2013.01); *H05K 2201/047* (2013.01); *H05K 2201/062* (2013.01); *H05K 2201/10083* (2013.01); *H05K 2201/10151* (2013.01)
USPC .................................................. 73/514.16

(58) Field of Classification Search
CPC .......... H05K 1/0201; H05K 2201/047; H05K 2201/10083
USPC .................................................. 73/514.16
See application file for complete search history.

(56) References Cited

U.S. PATENT DOCUMENTS

| | | | |
|---|---|---|---|
| 5,289,719 | A | 3/1994 | Egley et al. |
| 6,040,625 | A | 3/2000 | Ip |
| 6,456,939 | B1 | 9/2002 | McCall et al. |
| 6,778,908 | B2 | 8/2004 | Martorana et al. |
| 7,350,303 | B2 | 4/2008 | Rock et al. |
| 2004/0149036 | A1* | 8/2004 | Foxlin et al. ............ 73/511 |
| 2005/0104933 | A1* | 5/2005 | Silverbrook et al. ...... 347/56 |
| 2009/0212407 | A1* | 8/2009 | Foster et al. ............ 257/686 |
| 2009/0326851 | A1 | 12/2009 | Tanenhaus |
| 2010/0153012 | A1 | 6/2010 | Chappell et al. |
| 2011/0127365 | A1 | 6/2011 | Chappell |

OTHER PUBLICATIONS

Aggarwal, P., et al. (2008) A Standard Testing and Calibration Procedure for Low Cost MEMS Inertial Sensors and Units, *Journal of Navigation*, 61:323-336 (Abstract).

(Continued)

*Primary Examiner* — Hezron E Williams
*Assistant Examiner* — Gregory J Redmann
(74) *Attorney, Agent, or Firm* — Lando & Anastasi, LLP

(57) ABSTRACT

A micro-electro-mechanical systems (MEMS) inertial measurement system facilitates accurate location and/or attitude measurements via passive thermal management of MEMS inertial sensors. Accuracy of the system is also improved by subjecting the inertial sensors to programmed single-axis gimbal motion, and by performing coarse and fine adjustments to the attitude estimates obtained by the system based on the programmed motion and on the passive thermal management of the sensors.

23 Claims, 6 Drawing Sheets